United States Patent
Huang et al.

(10) Patent No.: US 7,700,986 B2
(45) Date of Patent: Apr. 20, 2010

(54) CHIP PACKAGE CARRIER AND FABRICATION METHOD THEREOF

(75) Inventors: Han-Pei Huang, Taoyuan County (TW); Chih-Peng Fan, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 64 days.

(21) Appl. No.: 12/208,843

(22) Filed: Sep. 11, 2008

(65) Prior Publication Data

US 2010/0013068 A1 Jan. 21, 2010

(30) Foreign Application Priority Data

Jul. 17, 2008 (TW) ............................... 97127215 A

(51) Int. Cl.
*H01L 27/108* (2006.01)
*H01L 29/76* (2006.01)
*H01L 29/00* (2006.01)
*H01L 23/34* (2006.01)
*H01L 21/02* (2006.01)
*H01L 21/20* (2006.01)
*H01L 21/8242* (2006.01)

(52) U.S. Cl. ............... 257/301; 257/532; 257/724; 257/E21.008; 438/381; 438/386; 438/239; 438/243

(58) Field of Classification Search ............... 257/301, 257/532, 724, E21.008; 438/381, 386, 239, 438/243

See application file for complete search history.

(56) References Cited

U.S. PATENT DOCUMENTS

| | | | | |
|---|---|---|---|---|
| 5,972,053 A * | 10/1999 | Hoffarth et al. | ............ | 29/25.03 |
| 6,395,996 B1 * | 5/2002 | Tsai et al. | ............... | 174/260 |
| 6,446,317 B1 * | 9/2002 | Figueroa et al. | ............ | 29/25.42 |
| 6,524,352 B2 * | 2/2003 | Adae-Amoakoh et al. | . | 29/25.03 |
| 6,642,563 B2 * | 11/2003 | Kanaya | ............... | 257/296 |
| 7,429,510 B2 * | 9/2008 | Das et al. | ............ | 438/253 |
| 7,449,381 B2 * | 11/2008 | Das et al. | ............ | 438/238 |
| 7,541,265 B2 * | 6/2009 | Das et al. | ............ | 438/528 |
| 7,550,320 B2 * | 6/2009 | Wang | ............... | 438/125 |
| 7,561,410 B1 * | 7/2009 | Lee et al. | ............ | 361/525 |
| 7,566,614 B2 * | 7/2009 | Lee | ............ | 438/243 |

* cited by examiner

*Primary Examiner*—Luan C Thai
(74) *Attorney, Agent, or Firm*—J.C. Patents

(57) ABSTRACT

A chip package carrier is disclosed, which includes a first circuit layer, a second circuit layer, a core layer, a third circuit layer, a first dielectric layer between the first and third circuit layers, a fourth conductive layer including at least a solder ball pad, a second dielectric layer between the second and fourth circuit layers and at least a capacitor device, wherein the core layer has at least a first through-hole; the third circuit layer is disposed above the first circuit layer and includes at least a die pad; the capacitor device is disposed in the first through-hole. The capacitor device herein includes a first pillar electrode covering the wall of the first through-hole, a cylindrical capacitor material disposed in the first pillar electrode and having a first blind hole, and a second pillar electrode disposed in the first blind hole and connected to the die pad.

22 Claims, 13 Drawing Sheets

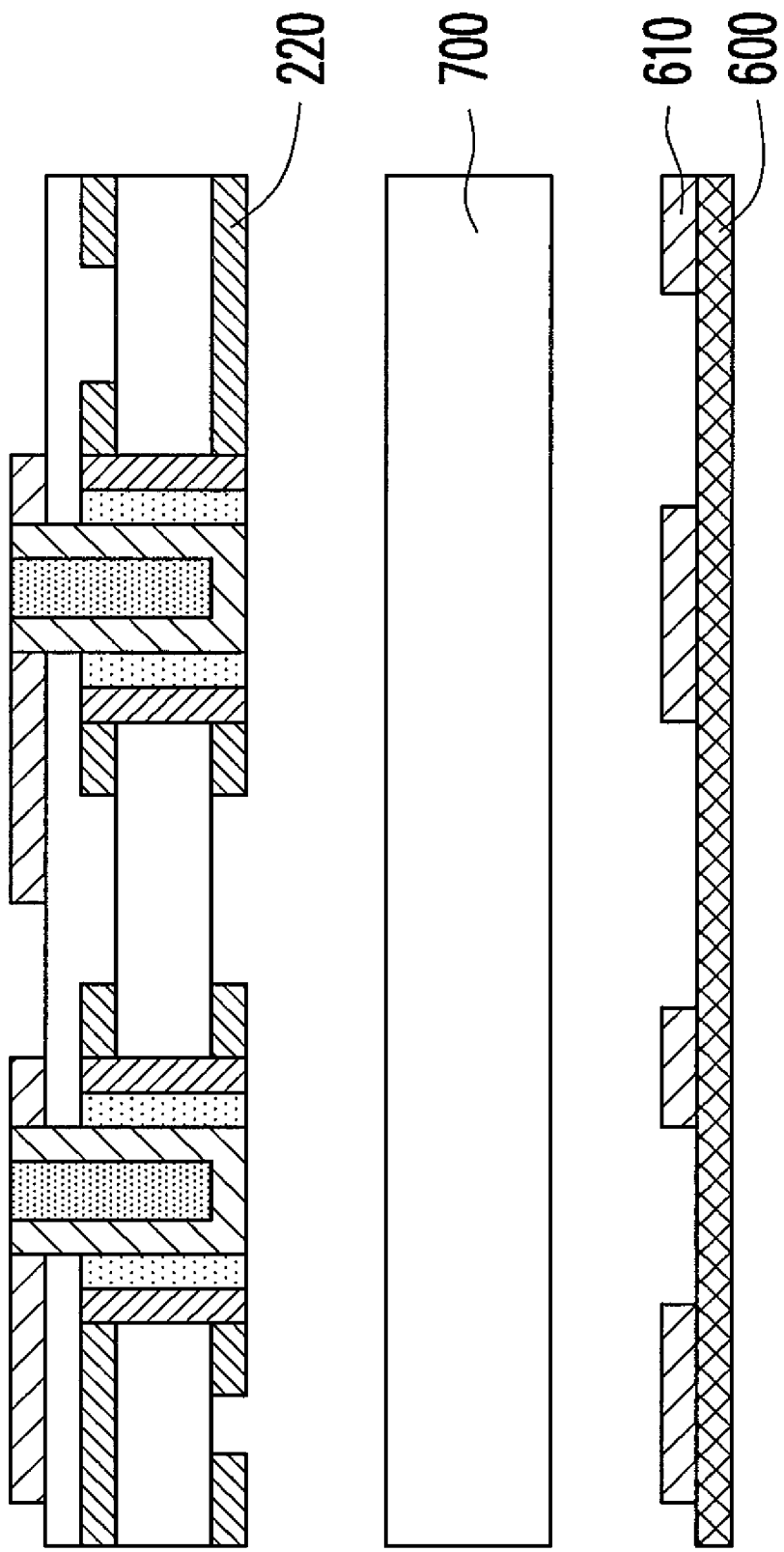

CHIP PACKAGE CARRIER AND FABRICATION METHOD THEREOF

CROSS-REFERENCE TO RELATED APPLICATION

This application claims the priority benefit of Taiwan application serial no. 97127215, filed on Jul. 17, 2008. The entirety of the above-mentioned patent application is hereby incorporated by reference herein and made a part of specification.

BACKGROUND OF THE INVENTION

1. Field of the Invention

The present invention generally relates to a circuit board, and more particularly, to a chip package carrier and a fabrication method thereof.

2. Description of Related Art

Along with the progress of the semiconductor technology, a chip nowadays employs a lot of transistors disposed therein and arranged in high density, and a lot of pads are disposed on a surface of the chip, wherein the chip is usually mounted on a chip package carrier and then packaged to form a chip package. The chip package carrier today usually has embedded capacitor devices, so that a chip package carrier with the embedded capacitor devices can reduce the amount of surface mounted capacitor device disposed thereon.

FIG. 1 is a sectional diagram of a conventional chip package carrier with a chip mounted thereon. Referring to FIG. 1, a conventional chip package carrier 100 includes two copper circuit layers 110a and 110b, two dielectric layers 120a and 120b, two solder mask layers 130a and 130b, a via plug 140 and an embedded capacitor device 150, wherein the chip package carrier 100 is electrically connected to a chip 10 through a plurality of solder bumps S1.

The embedded capacitor device 150 is disposed between the dielectric layers 120a and 120b, and the dielectric layers 120a and 120b respectively cover both the opposite surfaces of the embedded capacitor device 150. The copper circuit layers 110a and 110b are respectively located on the dielectric layers 120a and 120b, and the via plug 140 is connected between the copper circuit layers 110a and 110b.

The copper circuit layer 110a includes a plurality of traces 112a and a plurality of pads 114a, and the copper circuit layer 110b includes a plurality of traces 112b. The solder mask layer 130a covers the traces 112a and makes the pads 114a exposed; the solder mask layer 130b covers the traces 112b. The solder bumps S1 are connected between the pads 114a and the chip 10 so that the chip 10 is electrically connected to the chip package carrier 100.

The embedded capacitor device 150 includes an upper electrode 152a, a lower electrode 152b and a ceramic dielectric layer 154, wherein the upper electrode 152a does not contact the lower electrode 152b, and the ceramic dielectric layer 154 is disposed between the upper electrode 152a and the lower electrode 152b. In addition, the chip package carrier 100 further includes a pair of via plugs 160a and 160b, wherein the via plug 160a is connected between one of the pads 114a and the upper electrode 152a, and the via plug 160b is connected between another of the pads 114a and the lower electrode 152b, so that the chip is electrically connected to the embedded capacitor device 150.

The shorter distance D1 between the chip 10 and the embedded capacitor device 150, the less noise interference on the chip package carrier is, which is particularly obvious and important in a high-frequency signal propagation. Since the embedded capacitor device 150 usually has a low alignment accuracy, the embedded capacitor device 150 must take a wiring route through the via plugs 160a and 160b and the solder bumps S1 to connect the chip 10. However, when the number of the embedded capacitor devices 150 is too large, the horizontal disposition space of the conventional chip package carrier 100 is not sufficient to dispose the embedded capacitor devices 150 in horizontal disposition mode. On the other hand, to solve the above-mentioned problem, the size of the chip package carrier 100 must be increased, which makes the dimensions of a conventional chip package from being shortened. In this regard, many relevant companies have made great efforts and expect a solution to shorten the horizontal disposition space of the embedded capacitor device 150 and increase the signal transmission quality of the chip package carrier 100.

SUMMARY OF THE INVENTION

Accordingly, the present invention is directed to a chip package carrier and a fabrication method thereof so as to promote the signal transmission quality of a chip package carrier.

The present invention provides a chip package carrier, which includes a first circuit layer, a second circuit layer, a core layer, a third circuit layer, a first dielectric layer, a fourth conductive layer, a second dielectric layer and at least a capacitor device, wherein the core layer is disposed between the first circuit layer and the second circuit layer; the core layer has at least a first through-hole; the third circuit layer is disposed above the first circuit layer and the third circuit layer includes at least a die pad; the first dielectric layer is disposed between the first circuit layer and the third circuit layer; the fourth circuit layer is disposed under the second circuit layer and includes at least a solder ball pad; the second dielectric layer is disposed between the second circuit layer and the fourth circuit layer; the capacitor device is disposed in the first through-hole.

The capacitor device includes a first pillar electrode, a cylindrical capacitor material and a second pillar electrode. The first pillar electrode covers the wall of the first through-hole and is connected between the first circuit layer and the second circuit layer. The cylindrical capacitor material is disposed in the first pillar electrode and extended from the first circuit layer to the second circuit layer, and has a first blind hole with an extension direction the same as the axis direction of the first through-hole, wherein the first blind hole does not go through the second dielectric layer and the fourth circuit layer, and the second pillar electrode is disposed in the first blind hole and connected to the die pad.

In an embodiment of the present invention, the above-mentioned second pillar electrode is a hollow conductive pillar with a bottom portion and a hollow portion, wherein the bottom portion is exposed inside the hollow portion.

In an embodiment of the present invention, the above-mentioned capacitor device further includes a filling material, with which the hollow portion is filled.

In an embodiment of the present invention, the above-mentioned filling material is ink or a conductive material. The conductive material includes solder paste, copper paste or silver paste.

In an embodiment of the present invention, the above-mentioned die pad is connected to an end of the second pillar electrode.

The present invention also provides a fabrication method of a chip package carrier. The fabrication method includes: providing a substrate, wherein the substrate includes a first conductive layer, a second conductive layer and a core layer disposed between the first conductive layer and the second conductive layer; forming at least a first through-hole extended from the first conductive layer to the second conductive layer; forming at least a first pillar electrode, which covers the wall of the first through-hole and is connected between the first conductive layer and the second conductive layer; filling the first through-hole with a capacitance material, wherein the first pillar electrode is located between the capacitance material and the wall of the first through-hole.

The fabrication method further includes forming a metal layer on the second conductive layer, wherein the metal layer covers the capacitance material and an end of the first pillar electrode; after forming the metal layer, patterning the first conductive layer to form a first circuit layer; forming a first dielectric layer on the first circuit layer and forming a third conductive layer on the first dielectric layer; forming at least a first blind hole extended from the third conductive layer to the second circuit layer, wherein the first blind hole is located in the first through-hole and the first blind hole does not go through the metal layer; forming a second pillar electrode in the first blind hole, wherein the second pillar electrode is connected to the third conductive layer; patterning the second conductive layer and the third conductive layer to respectively form a second circuit layer and a third circuit layer, wherein the third circuit layer includes at least a die pad connected to the second pillar electrode.

In an embodiment of the present invention, the above-mentioned method for forming the first pillar electrode includes conducting a plating process of through-hole.

In an embodiment of the present invention, the above-mentioned method for forming the second pillar electrode includes conducting a plating process.

In an embodiment of the present invention, prior to forming the second pillar electrode in the first blind hole, the above-mentioned fabrication method further includes forming a plating-resistant layer on the metal layer.

In an embodiment of the present invention, the above-mentioned second pillar electrode is a hollow conductive pillar with a bottom portion and a hollow portion, wherein the bottom portion is exposed inside the hollow portion.

In an embodiment of the present invention, prior to patterning the third conductive layer, the above-mentioned fabrication method further includes filling the hollow portion with a filling material.

In an embodiment of the present invention, prior to filling the hollow portion with a filling material, the above-mentioned fabrication method further includes removing the plating-resistant layer.

In an embodiment of the present invention, after filling the hollow portion with a filling material, the above-mentioned fabrication method further includes removing the plating-resistant layer.

In an embodiment of the present invention, the above-mentioned filling material is ink.

In an embodiment of the present invention, the above-mentioned second pillar electrode is a solid conductive pillar.

In an embodiment of the present invention, the above-mentioned die pad is connected to an end of the second pillar electrode.

In an embodiment of the present invention, the above-mentioned method for forming the first dielectric layer and the third conductive layer includes laminating a copper foil onto the first circuit layer by using a semi-cured prepreg.

In an embodiment of the present invention, prior to patterning the second conductive layer and the third conductive layer, the above-mentioned fabrication method further includes removing the metal layer.

In an embodiment of the present invention, after patterning the second conductive layer and the third conductive layer, the above-mentioned fabrication method further includes: forming a second dielectric layer on the second circuit layer; forming a fourth conductive layer on the second dielectric layer; patterning the fourth conductive layer to form a fourth circuit layer, wherein the fourth circuit layer includes at least a solder ball pad.

In an embodiment of the present invention, the above-mentioned method for forming the second dielectric layer and the fourth conductive layer includes laminating a copper foil onto the second circuit layer by using a semi-cured prepreg.

In an embodiment of the present invention, the above-mentioned method for forming the first dielectric layer and the second dielectric layer includes spreading a liquid insulation resin to respectively cover the first circuit layer and the second circuit layer, pre-curing the liquid insulation resin into semi-cured coagulation state and then thermally laminating a copper foil onto the first dielectric layer and the second dielectric layer.

In an embodiment of the present invention, after pattering the second conductive layer and the third conductive layer, the above-mentioned fabrication method further includes: providing a carrier substrate having a fifth circuit layer; providing a third dielectric layer, wherein the third dielectric layer is located between the carrier substrate and the second circuit layer; laminating the carrier substrate onto the second circuit layer, wherein the second circuit layer and the fifth circuit layer are respectively embedded into both the opposite surfaces of the third dielectric layer.

Based on the described above, the chip package carrier of the present invention has a shorter distance between the capacitor device and the chip. Therefore, in comparison with the prior art, the invented chip package carrier has good signal transmission quality.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 6A-6C are sectional diagrams of a chip package carrier showing the subsequent processes after completing the chip package carrier by using the fabrication method illustrated by FIGS. 4A-4L, wherein the subsequent processes are to add a dielectric layer and a circuit layer thereon according to another embodiment of the present invention.

DESCRIPTION OF THE EMBODIMENTS

Figure 1:
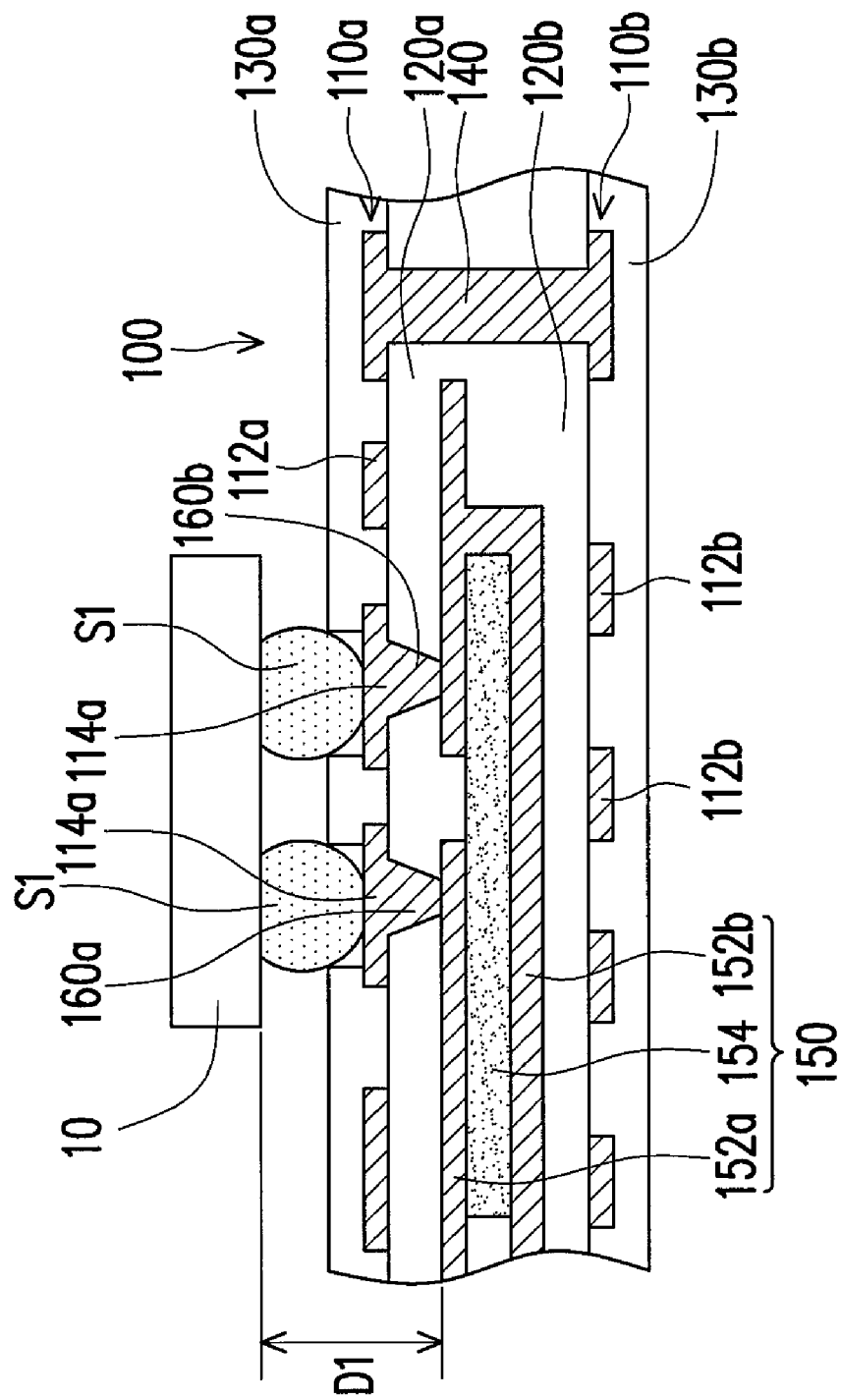
FIG. 1 is a sectional diagram of a conventional chip package carrier with a chip mounted thereon.

Reference will now be made in detail to the present embodiments of the invention, examples of which are illustrated in the accompanying drawings. Wherever possible, the same reference numbers are used in the drawings and the description to refer to the same or like parts.

Figure 2:
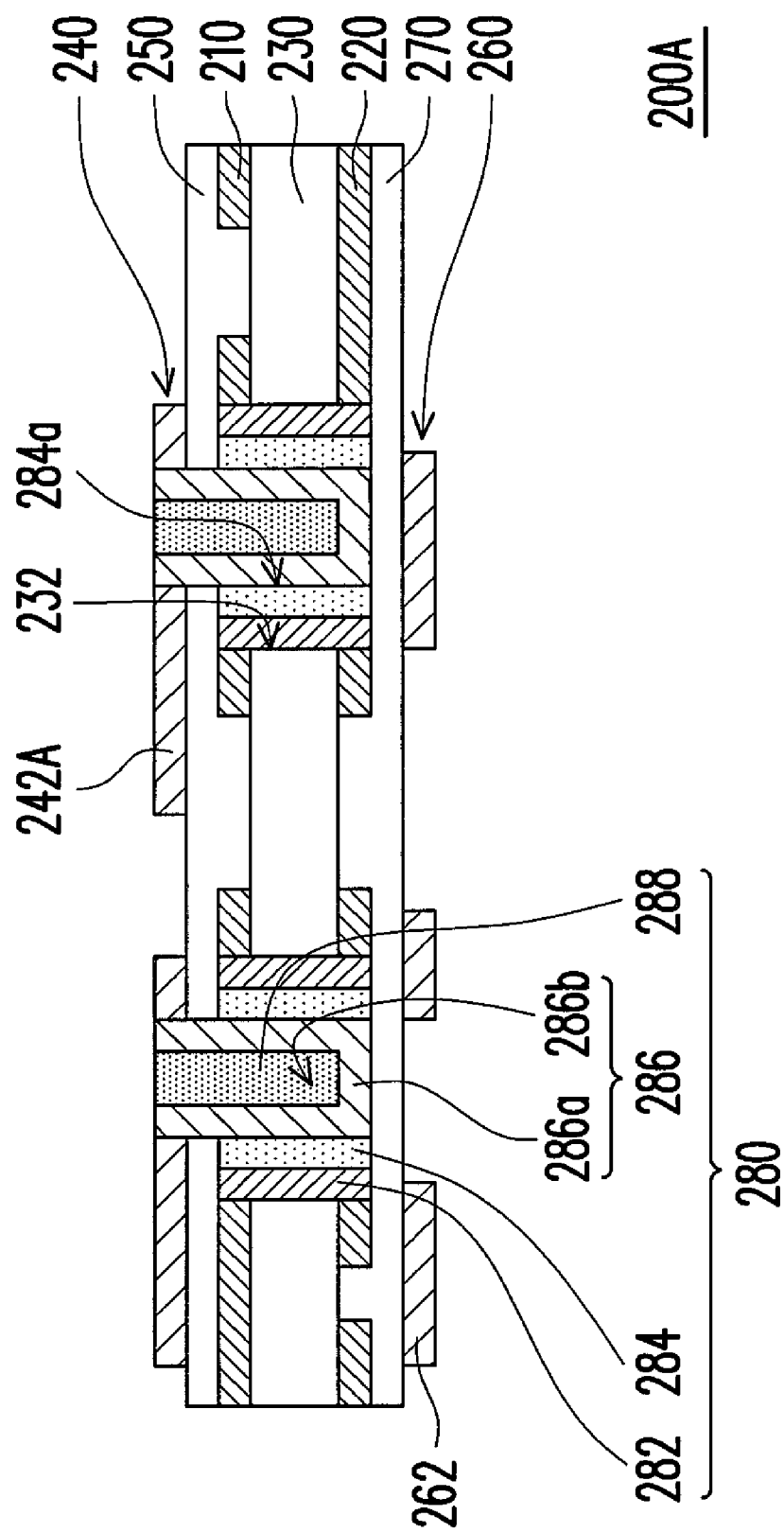
FIG. 2 is a sectional diagram of a chip package carrier according to an embodiment of the present invention.

FIG. 2 is a sectional diagram of a chip package carrier according to an embodiment of the present invention. Referring to FIG. 2, in the embodiment, the chip package carrier 200A includes a first circuit layer 210, a second circuit layer 220, a core layer 230, a third circuit layer 240, a first dielectric layer 250, a fourth circuit layer 260, a second dielectric layer 270 and at least a capacitor device 280 (in FIG. 2, only two capacitor devices are exemplarily shown).

In more detail, the core layer 230 is disposed between the first circuit layer 210 and the second circuit layer 220, and the core layer 230 has at least a first through-hole 232 (in FIG. 2, only two first through-holes are exemplarily shown). In the embodiment, the first through-holes 232 are extended from the first circuit layer 210 to the second circuit layer 220.

The third circuit layer 240 is disposed above the first circuit layer 210 and includes at least a die pad 242A (in FIG. 2, only two die pads are exemplarily shown), wherein the die pads 242A are made of, for example, copper. The first dielectric layer 250 is disposed between the first circuit layer 210 and the third circuit layer 240, wherein the first dielectric layer 250 can be a resin film.

The fourth circuit layer 260 is disposed under the second circuit layer 220 and includes at least a solder ball pad 262 (in FIG. 2, only three solder ball pads are exemplarily shown), wherein the solder ball pads 262 are made, for example, copper. The second dielectric layer 270 is disposed between the second circuit layer 220 and the fourth circuit layer 260, wherein the second dielectric layer 270 can be a resin film.

Continuing to FIG. 2, the capacitor devices 280 are respectively disposed in the first through-holes 232, wherein each of the capacitor devices 280 includes a first pillar electrode 282, a cylindrical capacitor material 284 and a second pillar electrode 286. In more detail, the first pillar electrode 282 covers the wall of the first through-hole 232 and is connected between the first circuit layer 210 and the second circuit layer 220. In the embodiment, the first pillar electrode 282 can be formed by conducting a plating process of the through-hole.

The cylindrical capacitor material 284 is disposed in the first pillar electrode 282 and is connected between the first circuit layer 210 to the second circuit layer 220. The cylindrical capacitor material 284 has a first blind hole 284a with an extension direction the same as that of the first through-hole 232, wherein the first blind hole 284a does not go through the second dielectric layer 270 and the fourth circuit layer 260.

The second pillar electrode 286 is disposed in the first blind hole 284a and is connected to the die pads 242A, wherein the die pad 242A is connected to an end of the second pillar electrode 286. The second pillar electrode 286 is a hollow conductive pillar with a bottom portion 286a and a hollow portion 286b and is slightly U-shaped or slightly cup-shaped, wherein the bottom portion 286a is exposed inside the hollow portion 286b. The capacitor devices 280 further includes a filling material 288 for filling the hollow portion 286b, wherein the filling material 288 is ink or a conductive material. The conductive material, for example, is solder paste, copper paste or silver paste).

Note that since the second pillar electrode 286 is U-shaped or cup-shaped by design; thus, the capacitor surface area of the second pillar electrode 286 includes the capacitor surface area of the surrounding wall plus the capacitor surface area of the bottom portion 286a thereof, which increases the charge-storage capacity of the capacitor devices 280.

Specially, the second pillar electrode 286 in the embodiment is a hollow conductive pillar, but in other unshown embodiments, the second pillar electrode 286 can be a solid conductive pillar as well. In fact, the design of the second pillar electrode 286 in FIG. 2 is an example only, which the present invention is not limited to.

Figure 3A:
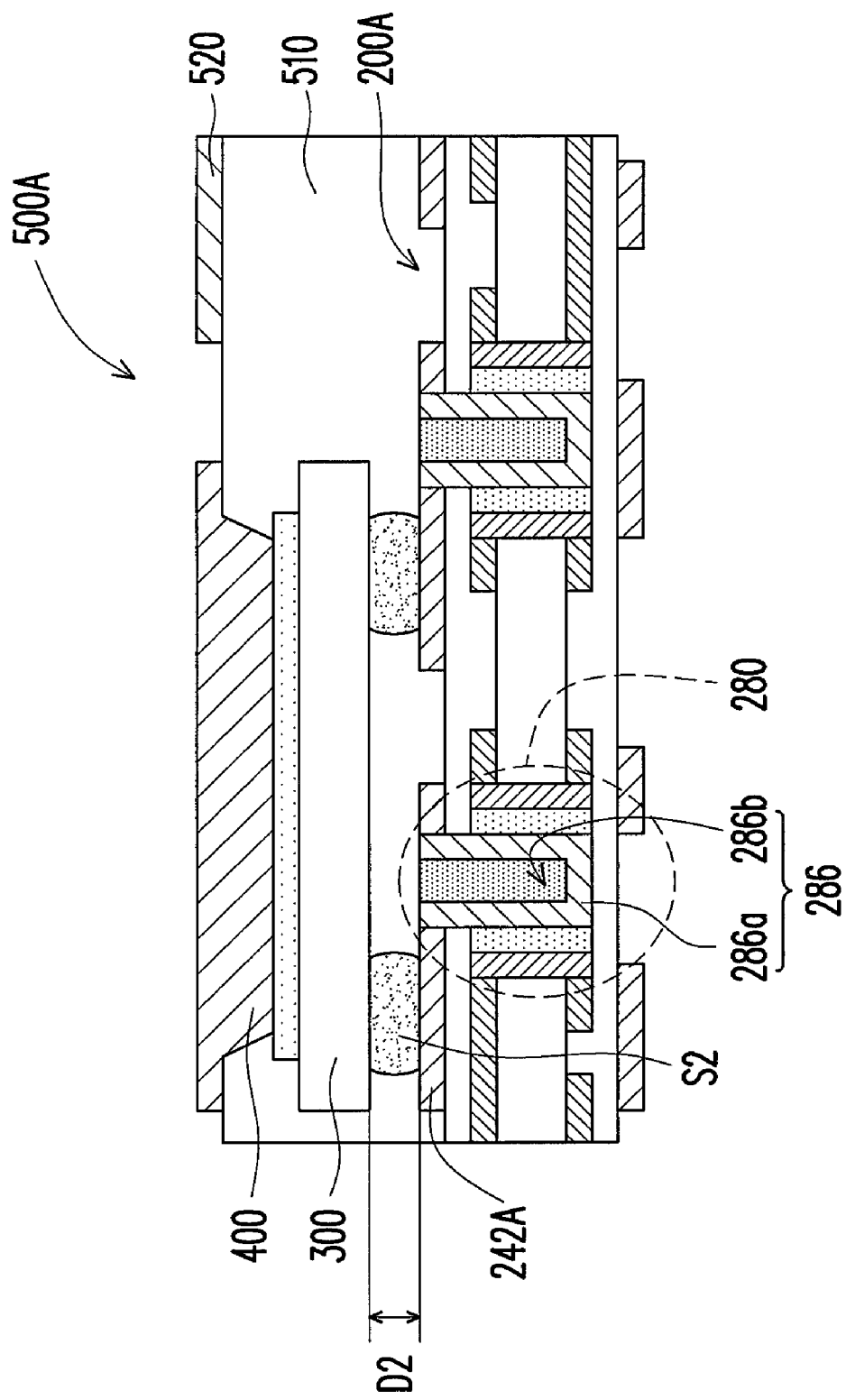
FIG. 3A is a sectional diagram of the chip package carrier of FIG. 2 with a chip mounted thereon so as to form a circuit board structure having an embedded chip.

FIG. 3A is a sectional diagram of the chip package carrier of FIG. 2 with a chip mounted thereon so as to form a circuit board structure having an embedded chip. Referring to FIG. 3A, in the embodiment, the die pads 242A of the chip package carrier 200A are connected to a chip 300 via a plurality of solder bumps S1 (in FIG. 3A, only two of them are shown), wherein the solder bumps S1 are, for example, tin bumps, copper pillar bumps or gold stud bumps.

In more detail, the solder bumps S1 are respectively located at a side of each the die pad 242A, wherein the die pads 242A are respectively connected to an end of each the second pillar electrode 286. In this way, the chip 300 is connected to the capacitor devices 280 via the die pads 242A and the solder bumps S1, so that the chip 300 is electrically connected to the chip package carrier 200A.

Figure 3B:
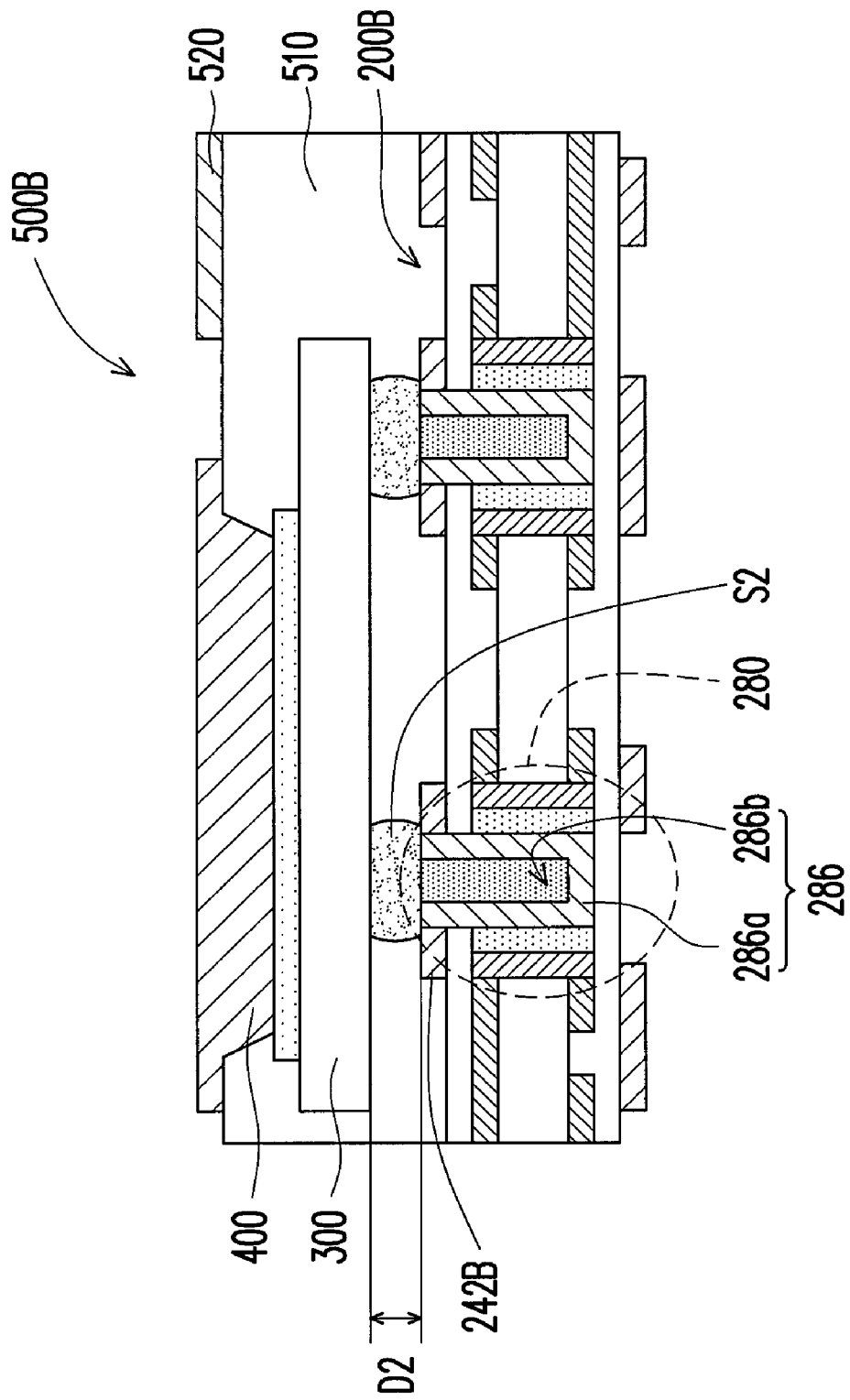
FIG. 3B is a sectional diagram of a chip package carrier with a chip mounted thereon so as to form a circuit board structure having an embedded chip according to another embodiment of the present invention.

The present invention does not limit the positions of the solder bumps S1. Despite the solder bumps S1 herein are respectively located at a side of each the die pad 242A; in other embodiments however, the solder bumps S1 can be located directly over the second pillar electrode 286 and crossly connected onto the two die pads 242A at both sides of the second pillar electrode 286, referring to FIG. 3B.

In particular, note that the chip 300 of the embodiment is embedded in a circuit board 500A by using a packaging process, wherein the circuit board 500A has a dielectric layer 510 and a circuit layer 520, and the chip 300 is embedded in the dielectric layer 510 to increase the utilization of the internal space of the circuit board 500A. In addition, the wiring layout that the chip 300 is connected to the capacitor devices 280 via the die pads 242A and the solder bumps S1 is advantageous in compacting the chip carrier package and shortening the vertical distance between the chip package carrier 200A and the chip 300. Moreover, the process of a chip package carrier having an embedded chip is described as following. First, a chip 300 is mounted on the chip package carrier 200A by the flip-chip process, and then a dielectric layer 510 covers the chip package carrier 200A and the chip 300 so that the chip is embedded into the dielectric layer 510. Afterward, a heat sink 400 on the top of the chip 300 and a circuit layer 520 are laminated on the dielectric layer 510.

During operations of the chip 300, significant heat is generated by the chip 300. In order to remove the heat energy of the chip 300, the heat sink module 400 is employed, which is disposed over the chip 300 and one side thereof is exposed out of dielectric layer 510 to effectively conduct heat exchange with the ambience.

Since the present embodiment makes the chip 300 electrically connected to the capacitor devices 280 of the chip package carrier 200A via the die pads 242A and the solder bumps S1; therefore, in comparison with the prior art (as shown by FIG. 1), the distance D2 between the chip 300 and the capacitor devices 280 in the present embodiment is much shorter, which promotes the signal transmission quality of the chip package carrier 200A, in particular, in the applications with high-frequency signal transmission.

In addition to the above-mentioned structure design features of the chip package carrier 200A, the present invention also provides a fabrication method of a chip package carrier. In the following, the fabrication method is depicted with accompanying diagrams of FIGS. 4A-6C, wherein the chip package carrier 200A is taken as an example.

Figure 4A:
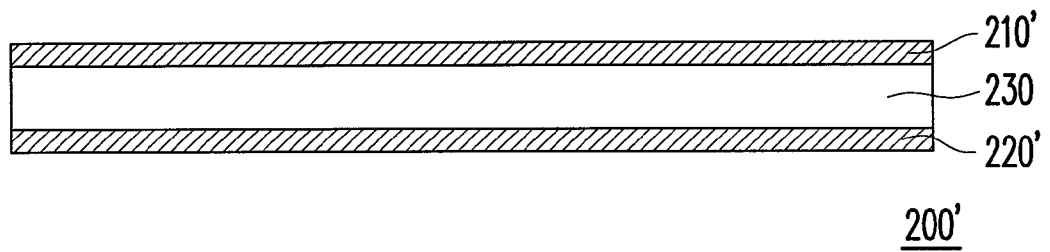
FIGS. 4A-4L are sectional diagrams of the chip package carrier of FIG. 2 showing the fabrication method thereof.

FIGS. 4A-4L are sectional diagrams of the chip package carrier of FIG. 2 showing the fabrication method thereof. Referring to FIG. 4A, a substrate 200' is provided. The substrate 200' includes a first conductive layer 210', a second conductive layer 220' and a core layer 230 disposed between the first conductive layer 210' and the second conductive layer 220'. In the embodiment, the substrate 200' is a double-side copper clad substrate.

Figure 4B:
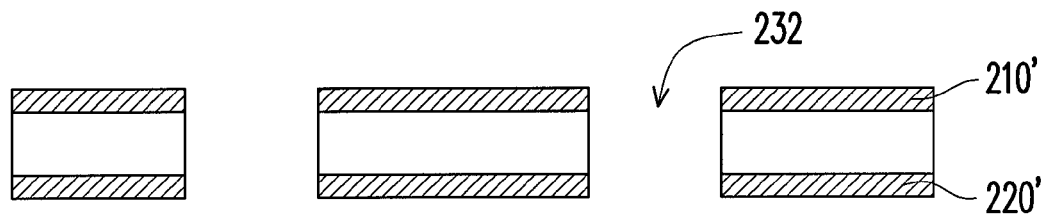

Then referring to FIG. 4B, at least a first through-hole 232 extended from the first conductive layer 210' to the second conductive layer 220' is formed (in FIG. 4B, only two of them are shown), wherein the method of forming the first through-holes 232 can be drilling, laser drilling or other appropriate processes.

Figure 4C:
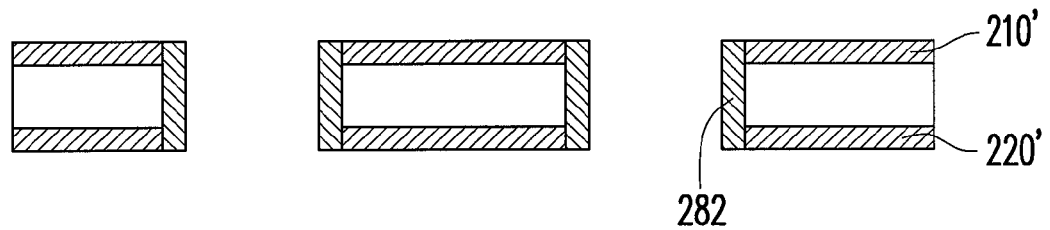

Then referring to FIGS. 4B and 4C, at least a first pillar electrode 282 is formed (in FIG. 4C, only two of them are shown). The first pillar electrodes 282 respectively cover the walls of the first through-holes 232 and are connected between the first conductive layer 210' and the second conductive layer 220', wherein the method of forming the first pillar electrodes 282 includes conducting a plating process, so that the first pillar electrodes 282 are electrically connected to the first conductive layer 210' and the second conductive layer 220'.

Figure 4D:
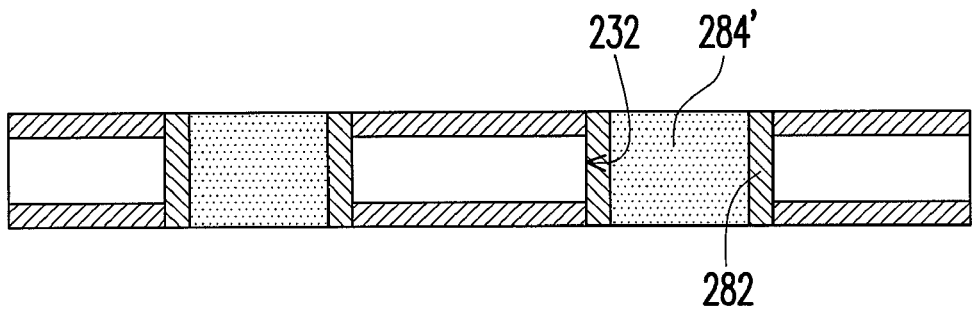

Then referring to FIG. 4D, after forming the first pillar electrodes 282, the first through-holes 232 are respectively filled with a capacitance material 284'. When the first through-holes 232 are filled up with the capacitance materials 284', the first pillar electrodes 282 are respectively located between the capacitance materials 284' and the walls of the first through-holes 232.

Figure 4E:
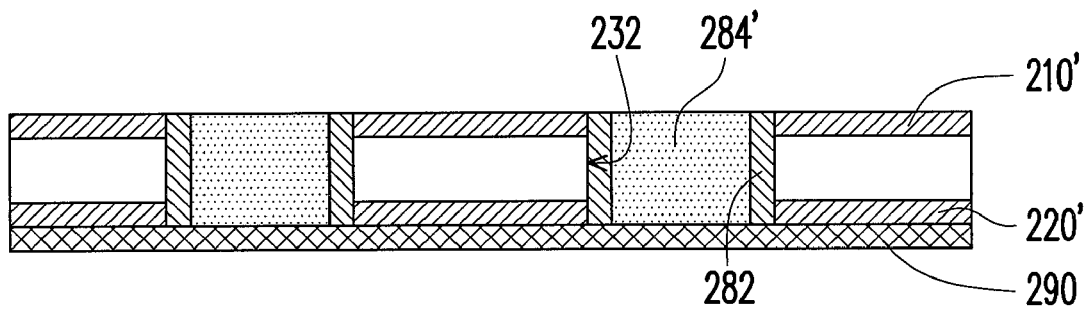

Then referring to FIG. 4E, a metal layer 290 is formed on the second conductive layer 220', wherein the metal layer 290 covers an end of each the first pillar electrode 282 and a part of the capacitance materials 284'. In the embodiment, the material of the metal layer 290 is different from the material of the first conductive layer 210' and the second conductive layer 220'.

Figure 4F:
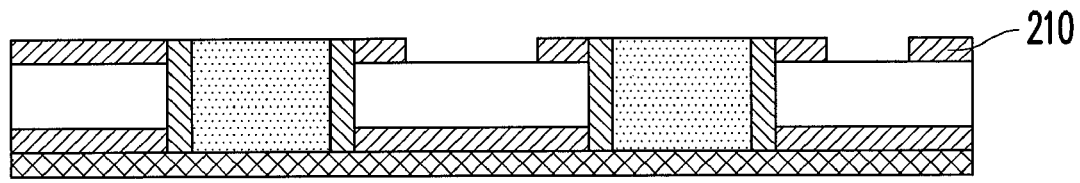

Then referring to FIG. 4F, the first conductive layer 210' is patterned to form a first circuit layer 210. In the embodiment, the method of patterning the first conductive layer 210' is, for example, conducting a lithography-etching process.

Figure 4G:
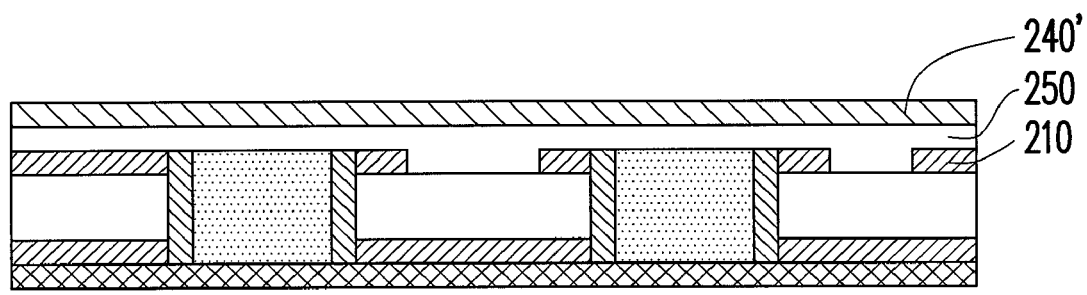

Then referring to FIG. 4G, a first dielectric layer 250 is formed on the first circuit layer 210 and a third conductive layer 240' is formed on the first dielectric layer 250.

In more detail, the method of forming the first dielectric layer 250 and the third conductive layer 240' includes laminating a copper foil onto the first circuit layer 210 by using a semi-cured prepreg. In more detail, the third conductive layer 240' is formed by laminating a copper foil onto the first circuit layer 210 by using a semi-cured prepreg; that is to say, the third conductive layer 240' is a copper foil layer. The semi-cured prepreg is located between the third conductive layer 240' and the first circuit layer 210; that is to say, the semi-cured prepreg is the first dielectric layer 250, wherein after laminating the semi-cured prepreg, the first dielectric layer 250 is formed by heating the semi-cured prepreg for curing purpose.

In other unshown embodiments, the method of forming the first dielectric layer 250 includes spreading a liquid insulation resin to clad the first circuit layer 210, then pre-curing the resin into semi-cured coagulation state and then laminating a copper foil onto the first dielectric layer 250 to form the third conductive layer 240'.

Figure 4H:
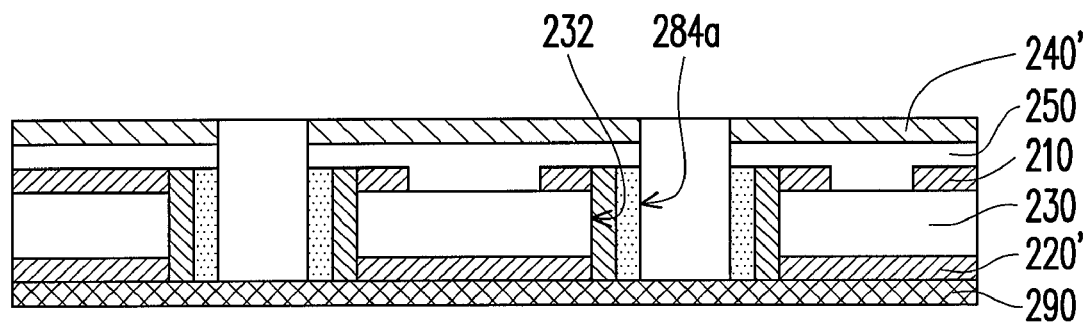

Then referring to FIG. 4H, at least a first blind hole 284a extended from the third conductive layer 240' to the metal layer 290 is formed (in FIG. 4H, only two of them are shown). The first blind holes 284a are respectively located in the first through-holes 232 and the first blind holes 284a do not go through the metal layer 290. In other words, the first blind holes 284a go through the third conductive layer 240', the first dielectric layer 250, the first circuit layer 210 and the core layer 230.

Figure 4I:
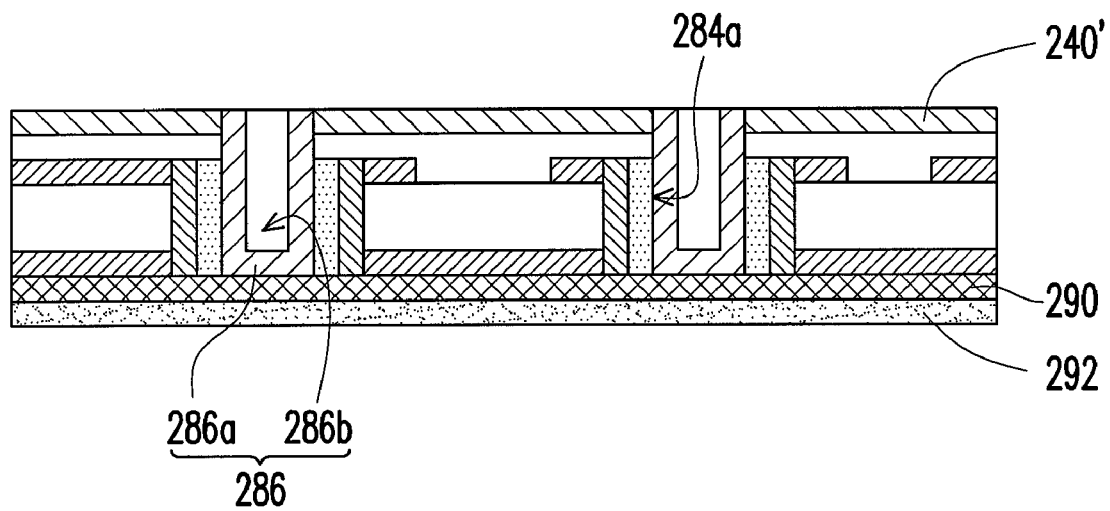

Then referring to FIG. 4I, a second pillar electrode 286 is formed in the first blind hole 284a, and meanwhile a plating-resistant layer 292 is formed on the metal layer 290, wherein the second pillar electrode 286 is connected to the third conductive layer 240'. In the embodiment, the method of forming the second pillar electrode 286 includes conducting a plating process. The plating-resistant layer 292 herein can prevent the surface of the metal layer 290 from being exposed in plating fluid.

In more detail, the second pillar electrode 286 is a hollow conductive pillar with a bottom portion 286a and a hollow portion 286b, wherein the electrode 286 is exposed inside the hollow portion 286b.

Figure 4J:
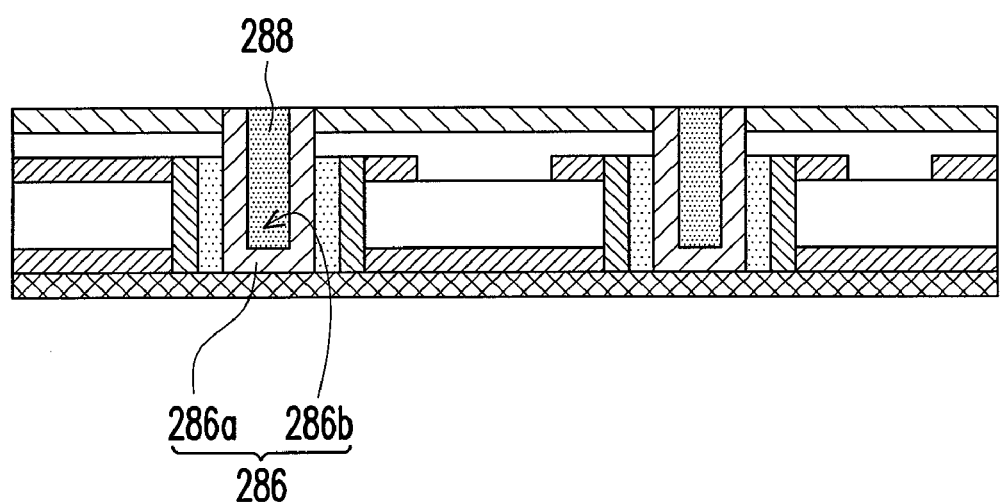

Then referring to FIG. 4J, the hollow portion 286b is filled up with a filling material 288 and the plating-resistant layer 292 is removed. The filling material 288 is, for example, ink or a conductive material. The process to fill up the hollow portion 286b of the second pillar electrode 286 with the filling material 288 can prevent producing voids inside the hollow portion 286b to cause a popcorn effect, wherein the conductive material can be conductive macromolecule material, copper paste, silver paste and carbon paste.

In the embodiment, the plating-resistant layer 292 can be removed prior to filling up the hollow portion 286b with the filling material 288 or after filling up the hollow portion 286b with the filling material 288.

Figure 4K:
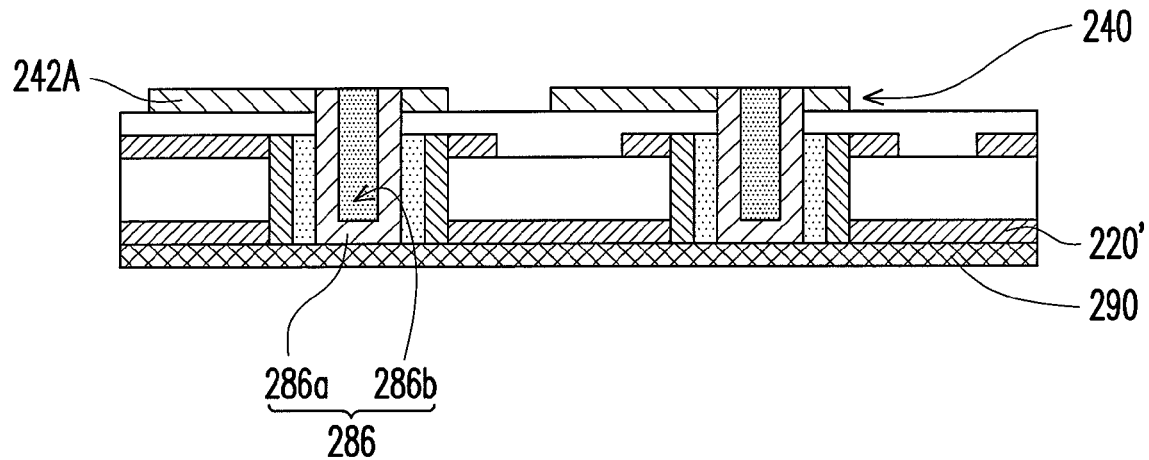
Figure 4L:
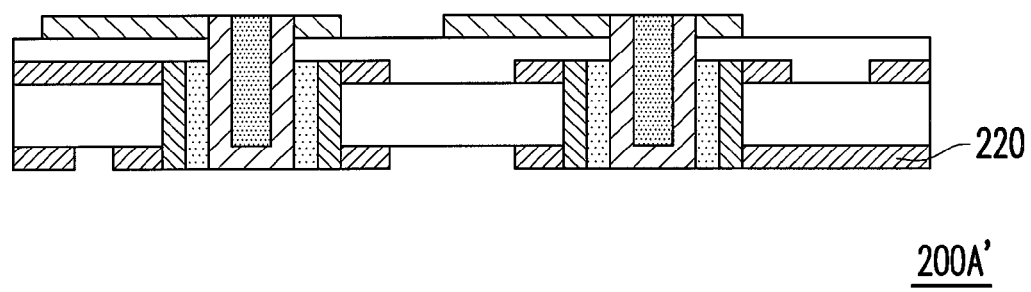

Then referring to FIGS. 4K and 4L, the third conductive layer 240' is patterned to form a third circuit layer 240, wherein the third circuit layer 240 includes at least a die pad 242A connecting the second pillar electrode 286 (in FIG. 4K, only two of them are shown). After that, the metal layer 290 is removed and the second conductive layer 220' is patterned to form a second circuit layer 220 where the fabrication method of the chip package carrier 200A' is nearly completed except to pattern the outer conductive layer into a circuit layer.

Figure 5A:
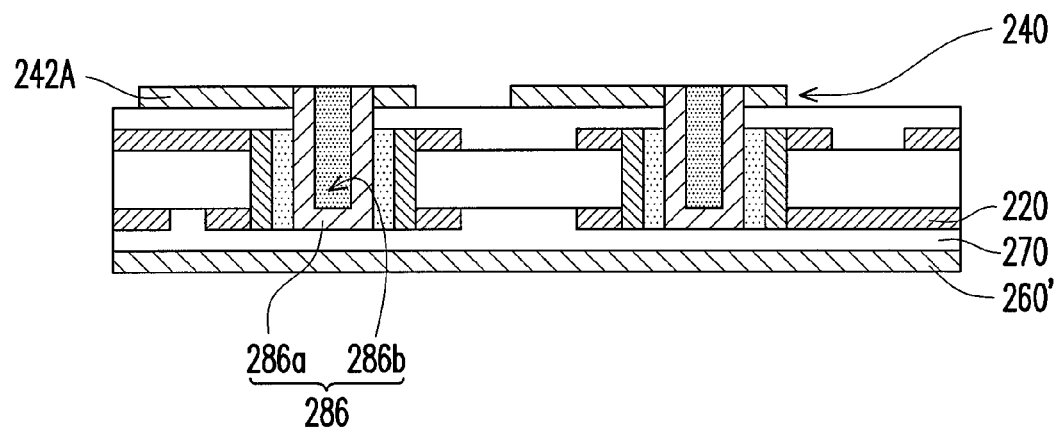
FIGS. 5A and 5B are sectional diagrams of a chip package carrier showing the fabrication method thereof according to an embodiment of the present invention.
Figure 5B:
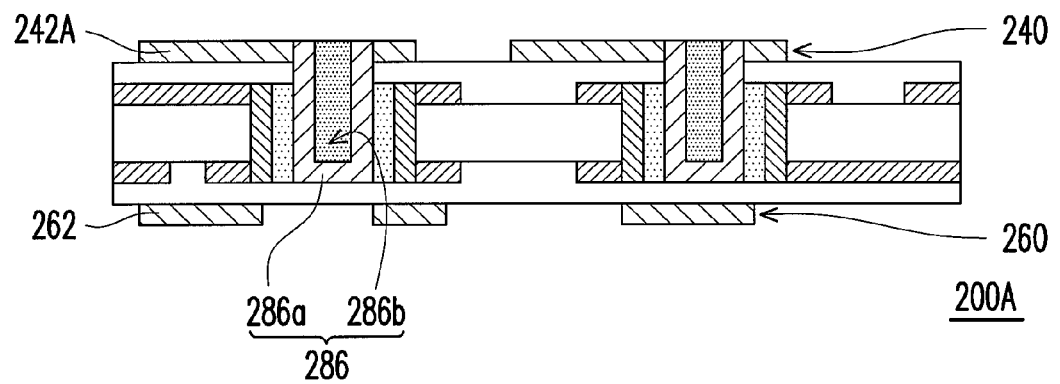
Figure 5C:
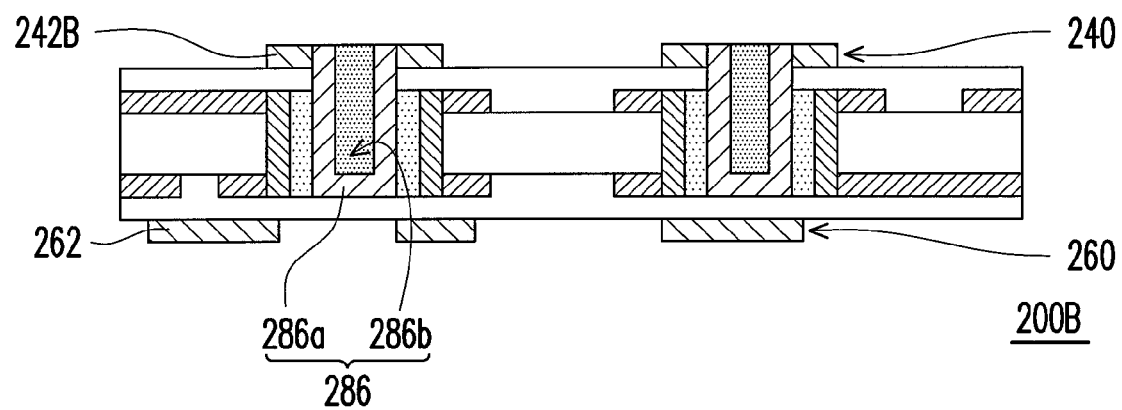
FIG. 5C is a sectional diagram of a chip package carrier showing the fabrication method thereof according to another embodiment of the present invention.

FIGS. 5A and 5B are sectional diagrams of the chip package carrier 200A showing the fabrication method thereof according to an embodiment of the present invention. Referring to FIGS. 5A and 5B, after the above-mentioned steps for fabricating the chip package carrier 200A' shown by FIGS. 4A-4L, a second dielectric layer 270 is formed on the second circuit layer 220 and a fourth conductive layer 260' is formed on the second dielectric layer 270.

The method of forming the second dielectric layer 270 and the fourth conductive layer 260' includes laminating a copper foil onto the second circuit layer 220 by using a semi-cured prepreg. In more detail, the fourth conductive layer 260' is formed by laminating a copper foil onto the second circuit layer 220 by using a semi-cured prepreg; that is to say, the fourth conductive layer 260' is a copper foil layer.

In other unshown embodiments, the method of forming the second dielectric layer 270 includes spreading a liquid insulation resin to clad the first circuit layer, then pre-curing the resin into semi-cured coagulation state and then thermally laminating a copper foil onto the second dielectric layer 270.

Then referring to FIG. 5B, the fourth conductive layer 260' is patterned to form a fourth circuit layer 260, wherein the fourth circuit layer 260 includes at least a solder ball pad 262 (in FIG. 5A, only three of them are shown). So far, the fabrication method of the chip package carrier 200A is nearly completed.

Note that the die pads 242A herein are designed in left-right asymmetry mode to connect each end of the second pillar electrode 286, wherein the design of the die pads 242A depends on the patterned third conductive layer 240'. In other embodiments, referring to FIG. 5C, the die pads 242B can be designed in left-right symmetry mode to connect each end of the second pillar electrode 286 as well.

In addition, the solder ball pads 262 can be electrically connected to other electronic components through solder balls (not shown), wherein the electronic components can be, for example, a circuit board. In the embodiment, the method of patterning the third conductive layer 240' and the fourth conductive layer 260' is, for example, conducting a lithography-etching process.

Figure 6B:
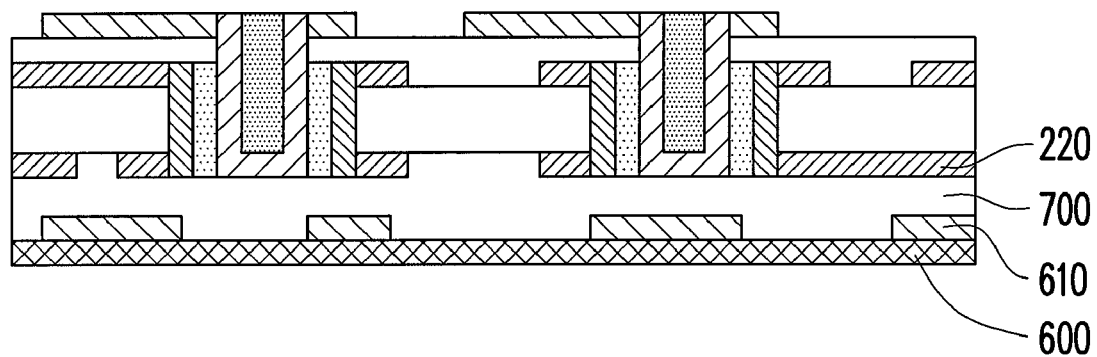
Figure 6C:
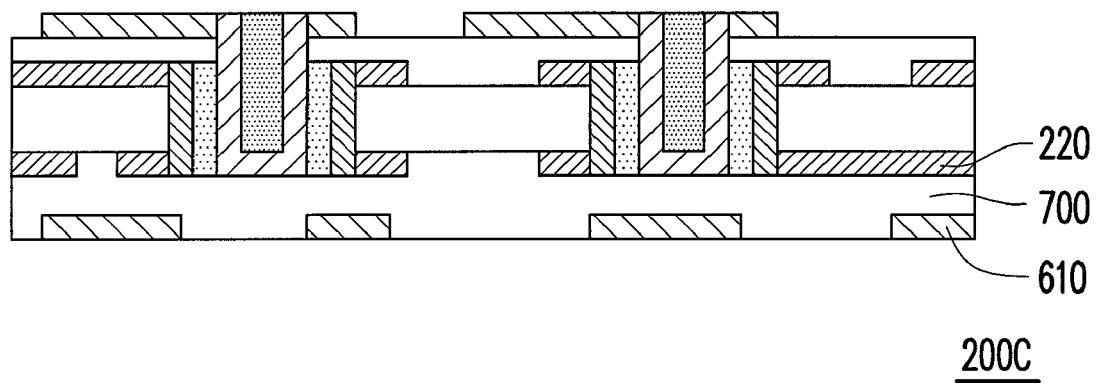

FIGS. 6A-6C are sectional diagrams of a chip package carrier showing the subsequent processes after completing the chip package carrier by using the fabrication method illustrated by FIGS. 4A-4L, wherein the subsequent processes are to add a dielectric layer and a circuit layer thereon according to another embodiment of the present invention. Referring to FIG. 6A, in the embodiment, after completing the fabrication steps of the chip package carrier 200A shown by FIGS. 4A-4L, a carrier substrate 600 having a fifth circuit layer 610 and a third dielectric layer 700 is provided, wherein the third dielectric layer 700 is located between the carrier substrate 600 and the second circuit layer 220.

In more detail, the carrier substrate 600 is laminated onto the second circuit layer 220 by applying a press force. After the carrier substrate 600 is laminated onto the second circuit layer 220, the second circuit layer 220 and the fifth circuit layer 610 are respectively embedded into the third dielectric layer 700, referring to FIG. 6B. The third dielectric layer 700 herein is, for example, a semi-cured prepreg. After laminating the semi-cured prepreg, the semi-cured prepreg is heated and cured into solid state; that is to say, the carrier substrate 600 would be adhered to the second circuit layer 220 through the third dielectric layer 700. In the end, referring to FIG. 6C, the carrier substrate 600 is removed to form a chip package carrier 200C having an embedded circuit structure.

In summary, since in the present invention the chip is connected to the capacitor device of the chip package carrier via the die pads and the solder bumps; therefore, in comparison with the prior art, the chip package carrier of the present invention is advantageous in shortening the distance between the chip and the capacitor device. In addition, against the conventional problem where the embedded capacitor devices are horizontally disposed so as to require increasing the dimension of the chip package carrier, the present invention adopts upright disposition for the embedded capacitor device, which allows to increase the number of the capacitor devices within the original disposing space without increasing the dimension of the carrier. Moreover, the upright disposed embedded capacitor device has the increased capacitor surface area with better charge-storing capacity; accordingly, the chip package carrier of the present invention has good signal transmission quality and particularly is suitable for the application with high-frequency signal transmission.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package carrier, comprising:
    a first circuit layer;
    a second circuit layer;
    a core layer, disposed between the first circuit layer and the second circuit layer and having at least a first through-hole;
    a third circuit layer, disposed above the first circuit layer and comprising at least a die pad;
    a first dielectric layer, disposed between the first circuit layer and the third circuit layer;
    a fourth circuit layer, disposed under the second circuit layer and comprising at least a solder ball pad; and
    a second dielectric layer, disposed between the second circuit layer and the fourth circuit layer; and
    at least a capacitor device, disposed in the first through-hole, wherein the capacitor device comprises:
        a first pillar electrode, covering the wall of the first through-hole and connected between the first circuit layer and the second circuit layer;
        a cylindrical capacitor material, disposed in the first pillar electrode and extended from the first circuit layer to the second circuit layer, and having a first blind hole with an extension direction the same as the axis direction of the first through-hole, wherein the first blind hole does not go through the second dielectric layer and the fourth circuit layer; and
        a second pillar electrode, disposed in the first blind hole and connected to the die pad.

2. The chip package carrier according to claim 1, wherein the second pillar electrode is a hollow conductive pillar with a bottom portion and a hollow portion, wherein the bottom portion is exposed inside the hollow portion.

3. The chip package carrier according to claim 2, wherein the capacitor device further comprises a filling material, with which the hollow portion is filled.

4. The chip package carrier according to claim 3, wherein the filling material is ink.

5. The chip package carrier according to claim 1, wherein the die pad is connected to an end of the second pillar electrode.

6. A fabrication method of a chip package carrier, comprising:
    providing a substrate, the substrate comprises a first conductive layer, a second conductive layer and a core layer disposed between the first conductive layer and the second conductive layer;
    forming at least a first through-hole extended from the first conductive layer to the second conductive layer;
    forming at least a first pillar electrode, wherein the first pillar electrode covers the wall of the first through-hole and is connected between the first conductive layer and the second conductive layer;
    filling the first through-hole with a capacitance material, wherein the first pillar electrode is located between the capacitance material and the wall of the first through-hole;
    forming a metal layer on the second conductive layer, wherein the metal layer covers the capacitance material and an end of the first pillar electrode;

after forming the metal layer, patterning the first conductive layer to form a first circuit layer;

forming a first dielectric layer on the first circuit layer and forming a third conductive layer on the first dielectric layer;

forming at least a first blind hole extended from the third conductive layer to the second circuit layer, wherein the first blind hole is located in the first through-hole and the first blind hole does not go through the metal layer;

forming a second pillar electrode in the first blind hole, wherein the second pillar electrode is connected to the third conductive layer; and patterning the second conductive layer and the third conductive layer to respectively form a second circuit layer and a third circuit layer, wherein the third circuit layer comprises at least a die pad connected to the second pillar electrode.

7. The fabrication method of a chip package carrier according to claim 6, wherein the method for forming the first pillar electrode comprises conducting a plating process of through-hole.

8. The fabrication method of a chip package carrier according to claim 6, wherein the method for forming the second pillar electrode comprises conducting a plating process.

9. The fabrication method of a chip package carrier according to claim 6, wherein prior to forming the second pillar electrode in the first blind hole, the fabrication method further comprises forming a plating-resistant layer on the metal layer.

10. The fabrication method of a chip package carrier according to claim 9, wherein the second pillar electrode is a hollow conductive pillar with a bottom portion and a hollow portion, wherein the bottom portion is exposed inside the hollow portion.

11. The fabrication method of a chip package carrier according to claim 10, wherein prior to patterning the third conductive layer, the fabrication method further comprises filling the hollow portion with a filling material.

12. The fabrication method of a chip package carrier according to claim 11, wherein prior to filling the hollow portion with the filling material, the fabrication method further comprises removing the plating-resistant layer.

13. The fabrication method of a chip package carrier according to claim 11, wherein after filling the hollow portion with the filling material, the fabrication method further comprises removing the plating-resistant layer.

14. The fabrication method of a chip package carrier according to claim 6, wherein the filling material is ink.

15. The fabrication method of a chip package carrier according to claim 6, wherein the second pillar electrode is a solid conductive pillar.

16. The fabrication method of a chip package carrier according to claim 6, wherein the die pad is connected to an end of the second pillar electrode.

17. The fabrication method of a chip package carrier according to claim 6, wherein the method for forming the first dielectric layer and the third conductive layer comprises laminating a copper foil onto the first circuit layer by using a semi-cured prepreg.

18. The fabrication method of a chip package carrier according to claim 6, wherein prior to patterning the second conductive layer and the third conductive layer, the fabrication method further comprises removing the metal layer.

19. The fabrication method of a chip package carrier according to claim 6, wherein after patterning the second conductive layer and the third conductive layer, the fabrication method further comprises:

forming a second dielectric layer on the second circuit layer;

forming a fourth conductive layer on the second dielectric layer; and patterning the fourth conductive layer to form a fourth circuit layer, wherein the fourth circuit layer comprises at least a solder ball pad.

20. The fabrication method of a chip package carrier according to claim 19, wherein the method for forming the second dielectric layer and the fourth conductive layer comprises laminating a copper foil onto the second circuit layer by using a semi-cured prepreg.

21. The fabrication method of a chip package carrier according to claim 19, wherein the method for forming the first dielectric layer and the second dielectric layer comprises spreading a liquid insulation resin to respectively cover the first circuit layer and the second circuit layer, and then pre-curing the liquid insulation resin into semi-cured coagulation state.

22. The fabrication method of a chip package carrier according to claim 6, wherein after patterning the second conductive layer and the third conductive layer, the fabrication method further includes:

providing a carrier substrate having a fifth circuit layer;

providing a third dielectric layer, wherein the third dielectric layer is located between the carrier substrate and the second circuit layer; and laminating the carrier substrate onto the second circuit layer, wherein the second circuit layer and the fifth circuit layer are respectively embedded into both the opposite surfaces of the third dielectric layer.

* * * * *